United States Patent
Chen et al.

(10) Patent No.: US 11,380,384 B2
(45) Date of Patent: Jul. 5, 2022

(54) BURIED POWER RAIL STRUCTURE FOR PROVIDING MULTI-DOMAIN POWER SUPPLY FOR MEMORY DEVICE

(71) Applicant: Arm Limited, Cambridge (GB)

(72) Inventors: Andy Wangkun Chen, Austin, TX (US); Sriram Thyagarajan, Austin, TX (US); Yew Keong Chong, Austin, TX (US); Sony, Noida (IN); Ettore Amirante, Nice (FR); Ayush Kulshrestha, New Delhi (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/006,689

(22) Filed: Aug. 28, 2020

(65) Prior Publication Data
US 2022/0068346 A1    Mar. 3, 2022

(51) Int. Cl.
| | |
|---|---|
| *G11C 5/14* | (2006.01) |
| *G11C 11/4074* | (2006.01) |
| *G11C 11/4094* | (2006.01) |
| *G11C 7/10* | (2006.01) |
| *G11C 11/4091* | (2006.01) |
| *G11C 11/413* | (2006.01) |

(52) U.S. Cl.
CPC ............ *G11C 11/4074* (2013.01); *G11C 5/14* (2013.01); *G11C 5/144* (2013.01); *G11C 5/146* (2013.01); *G11C 7/1012* (2013.01); *G11C 11/4091* (2013.01); *G11C 11/4094* (2013.01); *G11C 11/413* (2013.01)

(58) Field of Classification Search
CPC ....... G11C 11/4074; G11C 5/14; G11C 5/144; G11C 11/4094; G11C 11/4091; G11C 5/146; G11C 7/1012; G11C 11/413; H01L 21/743; H01L 21/76224; H01L 23/50; H01L 23/5286; H01L 21/76895; H01L 21/76897
See application file for complete search history.

(56) References Cited

U.S. PATENT DOCUMENTS

| | | | |
|---|---|---|---|
| 2015/0187402 A1* | 7/2015 | Chun | G11C 11/4074 365/230.02 |
| 2017/0154655 A1* | 6/2017 | Seo | G11C 5/14 |
| 2017/0213821 A1* | 7/2017 | Or-Bach | H01L 21/6835 |
| 2020/0042668 A1* | 2/2020 | Peng | G03F 1/70 |
| 2020/0105671 A1* | 4/2020 | Lai | G06F 30/394 |
| 2021/0118798 A1* | 4/2021 | Liebmann | H01L 21/76877 |

* cited by examiner

*Primary Examiner* — Mushfique Siddique
(74) *Attorney, Agent, or Firm* — Pramudji Law Group PLLC; Ari Pramudji

(57) ABSTRACT

Various implementations described herein are related to a device having memory circuitry with a bitcell array. The device may include a frontside power network that is coupled to the bitcell array, and the device may include a backside power network that provides power to the bitcell array. The device may include transition vias that couple the backside power network to the frontside power network, and the backside power network may provide power to the bitcell array by way of the transition vias being coupled to the frontside power network.

20 Claims, 4 Drawing Sheets

BURIED POWER RAIL STRUCTURE FOR PROVIDING MULTI-DOMAIN POWER SUPPLY FOR MEMORY DEVICE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some memory architecture designs, conventional power rails can be buried in memory, wherein metal power lines can be buried in the substrate, and these lines can be used as power rails for voltage distribution from backside circuitry. However, in these conventional memory designs, memory cells typically use frontside power rails for voltage distribution to frontside circuitry including the memory cells. Unfortunately, conventional memory designs are inefficient in that use of frontside power rails for memory cells suffers from area penalty in fabrication. Therefore, there exists a need to improve conventional memory designs to improve area efficiency of modern memory architecture.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to backside-to-frontside power transition schemes and techniques that transition power between a backside power network and a frontside power network in various memory applications. For instance, the various power transition schemes and techniques described herein provide a power rail architecture for memory circuitry having a bitcell array and control logic disposed adjacent to the bitcell array. The power rail architecture may be implemented with a frontside power network coupled to the bitcell array and a backside power network that provides power to the bitcell array and the control logic. The power rail architecture may also have transition vias that couple the backside power network to the frontside power network. The backside power network may provide power to the bitcell array by way of the transition vias being coupled to the frontside power network, and also, the backside power network may further provide power directly to the control logic by way of the transition vias.

Various implementations of frontside-to-backside transitioning schemes and techniques will be described in detail herein with reference to FIGS. 1-4.

Figure 1:
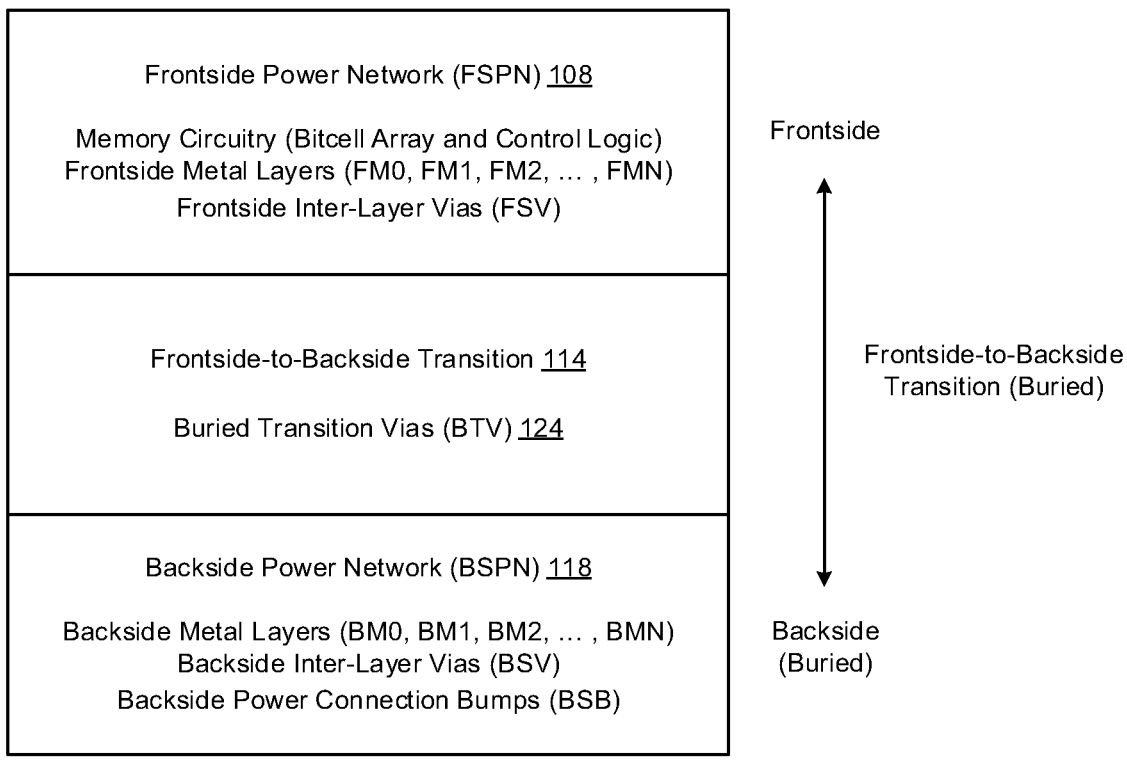
FIG. 1 illustrates a schematic diagram of buried power rail (BPR) architecture in accordance with various implementations described herein.

FIG. 1 illustrates a diagram 100 of buried power rail (BPR) architecture 104 in accordance with various implementations described herein. In some implementations, the BPR architecture 104 may be configured to provide backside-to-frontside transitioning architecture using a buried backside power network (BSPN) along with a frontside power network (FSPN) in accordance with implementations described herein.

In various implementations, the BPR architecture 104 may be implemented as a system or a device having various integrated circuit (IC) components that are arranged and coupled together as an assemblage or combination of parts that provide for a physical circuit design and related structures. In some instances, a method of designing, providing and building the BPR architecture 104 as an integrated system or device may involve use of various IC circuit components described herein to thereby implement various frontside-to-backside transitioning techniques associated therewith. The BPR architecture 104 may be integrated with computing circuitry and related components on a single chip, and the BPR architecture 104 may be implemented in various embedded systems for automotive, electronic, mobile, server and Internet-of-things (IoT) applications.

As shown in FIG. 1, the BPR architecture 104 may include a frontside power network (FSPN) 108 having memory circuitry, such as, e.g., a bitcell array and various control logic disposed adjacent to the bitcell array. The bitcell array may include bitcells arranged in an array (e.g., a column or a row of bitcells) and header logic coupled to the bitcells, and the control logic may refer to input-output (I/O) control logic having sense amplifier logic and column multiplexer logic. Also, the frontside power network (FSPN) 108 may include one or more frontside metal layers (e.g., FM0, FM1, FM2, . . . , FMN) along with frontside inter-layer vias (FSV) that may be used to provide frontside power rails to various components of the memory circuitry, such as, e.g., the bitcell array and the header logic. Also, the memory circuitry may be configured to operate in multiple core voltage domains, wherein the bitcell array is configured to operate in an internal core voltage domain (VDDC), and also, wherein the header logic is configured to operate in an external core voltage domain (VDDCE). The frontside power network (FSPN) 1108 may also provide ground, such as, e.g., an external ground (VSSE).

The BPR architecture 104 may include a backside power network (BSPN) 118 that provides power to the memory circuitry, such as, e.g., the bitcell array and the control logic that is disposed adjacent to the bitcell array. The backside power network (BSPN) 118 may include one or more buried metal layers (e.g., BM0, BM1, BM2, . . . , BMN) along with backside inter-layer vias (BSV) that supply one or more core voltages and periphery voltages in multiple voltage domains, wherein the core voltage domain may refer to an external core voltage domain (VDDCE), and wherein the periphery voltage domains may refer to an internal periphery voltage domain (VDDP) and an external periphery voltage domain (VDDPE). The backside power network (BSPN) 118 may also provide ground, such as, e.g., an external ground (VSSE). Also, the backside power network (BSPN) 118 may include backside power connection bumps (BSB).

The BPR architecture 104 may include the frontside-to-backside transition 114 having buried transition vias 124 that are configured to couple the backside power network (BSPN) 118 to the frontside power network (FSPN) 108. In some implementations, the transition 114 may be referred to as buried transition circuitry, wherein the buried transition may include backside-to-frontside transition cells having the buried transition vias 124 that are used to couple (and provide power from) the backside power network (BSPN) 118 to the frontside power network (FSPN) 108. Also, the transition vias may be used to couple the backside power network (BSPN) to the control logic. In some instances, the backside power network (BSPN) may provide power to the bitcell array by way of the transition vias being coupled to the frontside power network (FSPN), and the backside power network (BSPN) may provide power directly to the control logic by way of the transition vias.

In various implementations, the backside power network (BSPN) may include multiple backside power networks (or power supply nets), including, e.g., a first backside power network, a second backside power network, and a third backside power network, that may be configured to provide power to the memory circuitry. The first backside power network may be coupled to the frontside power network (FSPN) by way of the transition vias, the first backside power network may provide the external core voltage (VDDCE) to the header logic, and the header logic may receive the external core voltage (VDDCE) and provide the internal core voltage (VDDC) to the bitcell array. The second backside power network may be coupled directly to the sense amplifier logic, and also, the second backside power network may provide the internal periphery voltage (VDDP) to the sense amplifier logic. The third backside power network may be coupled directly to the column multiplexer logic, and also, the third backside power network may provide the external periphery voltage (VDDPE) to the column multiplexer logic.

In various implementations, the frontside power network (FSPN) 108 may be disposed above the backside power network (BSPN) 118, and the transition 114 may be disposed between the frontside power network (FSPN) 108 and the backside power network (BSPN) 118. The frontside-to-backside transition 114 may provide for a power delivery architecture that may be configured to transition between frontside power supply rails and backside power supply rails in some memory applications. In some instances, the backside power network (BSPN) provides various power (VDDCE, VDDP, VDDPE) to the memory circuitry by way of different power supply nets, and also, the power delivery architecture may be configured to keep power (VDDC) to the bitcell array in the frontside by way of the transition vias and header logic and then transition power (VDDP, VDDPE) directly to the control logic by way of the transition vias. These features and various other concepts related thereto are described herein below in reference to FIGS. 2-3.

Figure 2:
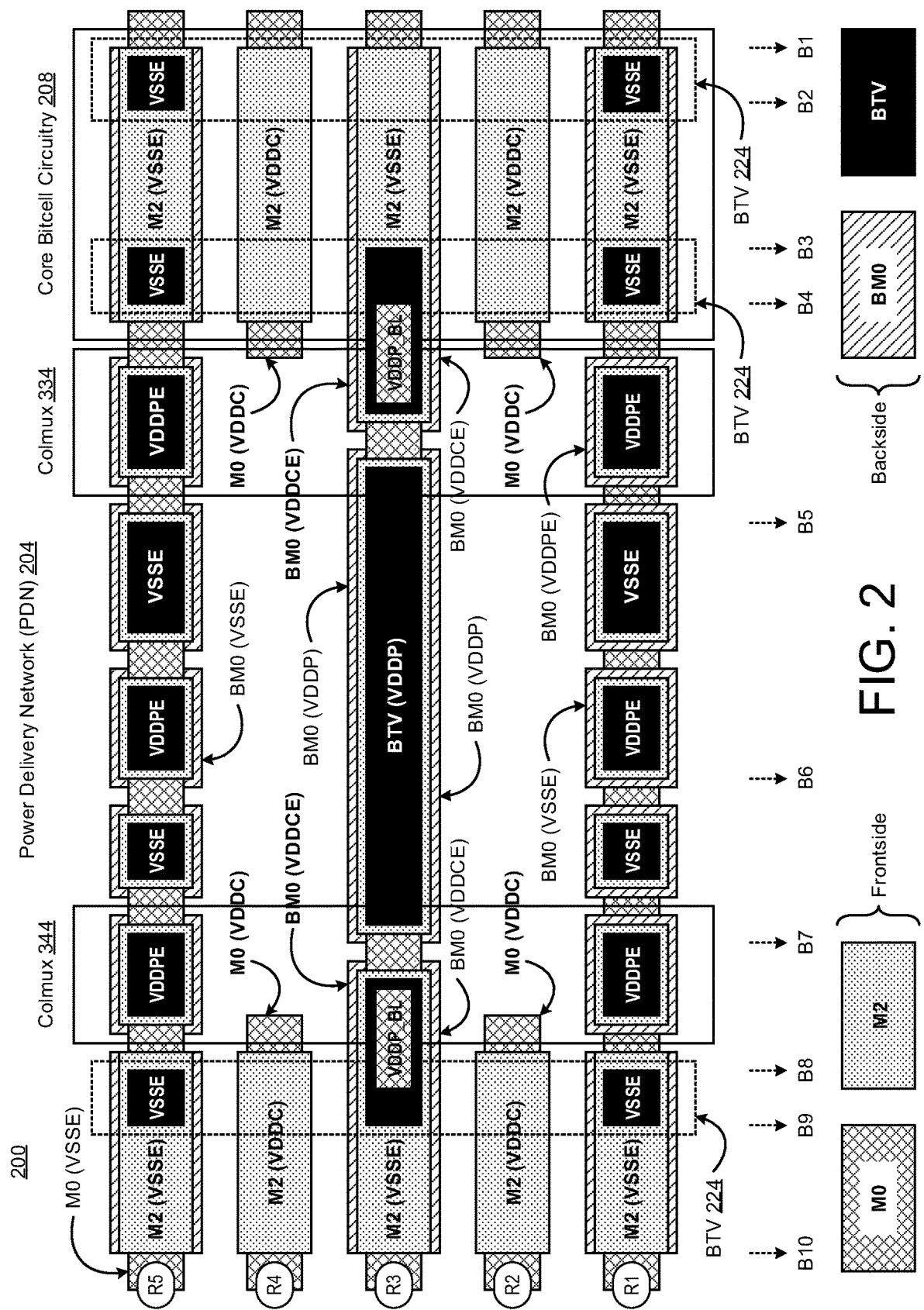
FIG. 2 illustrates a diagram of a power delivery network (PDN) in accordance with various implementations described herein.

FIG. 2 illustrates a schematic diagram 200 of a power delivery network (PDN) 204 in accordance with implementations described herein. In some implementations, the PDN architecture 204 may provide backside-to-frontside transition architecture using the backside power network (BSPN) and the frontside power network (FSPN) in accordance with various implementations described herein.

As shown in FIG. 2, the power delivery network (PDN) 204 may include power rails (e.g., R1-R5) for the core power domain (e.g., VDDC, VDDCE) and for the periphery power domain (VDDP, VDDPE) that overlap each other. In various implementations, the power rails (R1-R5) may include frontside power rails (R1-R5) formed with frontside metal layers (e.g., M0, M2), and also, the power rails (R1-R5) may include backside power rails (R1, R3, R5) formed with buried backside metal layers (BM0). The backside metal layers (BM0) may be coupled to the frontside metal layers (M0, M2) with buried transition vias (BTV) 224 that may be formed with the backside metal layers (BM0).

In some implementations, the frontside power network (FSPN) may be formed with frontside metals, and the backside power network (BSPN) may be formed with buried backside metals that are disposed underneath the frontside metals. The transition vias may refer to buried transition vias that are disposed between the frontside metals and the buried backside metals. The backside-to-frontside transition cells may include the buried transition vias that are configured to couple the backside power network (BSPN) to the frontside power network (FSPN), and the backside power network (BSPN) may provide power to the bitcell array (e.g., 330 in FIG. 3) by way of the buried transition vias being coupled to the frontside power network (FSPN). Also, the backside-to-frontside transition cells may include the buried transition vias that are used to couple the backside power network (BSPN) to the control logic (e.g., 334, 338, 340, 344 in FIG. 3), and the backside power network (BSPN) may also provide power directly to the control logic (e.g., 334, 338, 340, 344 in FIG. 3) by way of the buried transition vias.

The power delivery network (PDN) 204 may include the memory circuitry having the bitcell array formed in bitcell circuitry 208 that are coupled to the frontside metal layers (M0, M2) of the frontside power rails (R1-R5). Therefore, in various implementations, the memory circuitry may include one or more metal layers (e.g., M0, M2) that are configured to supply core voltage in multiple domains including, e.g., the internal core voltage domain (VDDC) and the external core voltage domain (VDDCE). In some implementations, the backside power network (BSPN) may be configured to provide power to the header logic (e.g., 332A, 332B, 332C in FIG. 3) in the VDDCE domain, and the header logic (e.g., 332A, 332B, 332C in FIG. 3) may then be configured to provide power to the bitcells in the bitcell array (e.g., 330 in FIG. 3) in the VDDC domain.

The power delivery network (PDN) 204 may also include the backside power network (BSPN), wherein some memory components, such as, e.g., column multiplexer circuitry (colmux 334, 344) may be coupled directly to the backside power rails (R1, R3, R5) formed with the backside metal layers (BM0). In some implementations, the column multiplexer circuitry (colmux 334, 344) and other components (e.g., 334, 338, 340, 344 in FIG. 3) may be formed as part of the memory circuitry; however, power to the column multiplexer circuitry (colmux 334, 344) and other components (e.g., 334, 338, 340, 344 in FIG. 3) may be provided directly from the backside power network (BSPN) by way of the buried transition vias. Therefore, the backside power network (BSPN) may have one or more buried metal layers (e.g., BM0) that are configured to supply periphery voltage in multiple domains including, e.g., an internal periphery voltage domain (VDDP) and an external periphery voltage domain (VDDPE).

The power delivery network (PDN) 204 may include transition cell architecture having buried transition vias (BTV) 224 that are configured/used to couple the backside power network (BSPN) to the frontside power network (FSPN). The buried transition vias (BTV) 224 may be configured to provide transition cell architecture between the backside power rails (R1, R3, R5) to the frontside power rails (R1-R5). The transition architecture may refer to buried transition circuitry having one or more backside-to-frontside transition cells with the buried transition vias (BTV) 224 that may be configured to provide power to the memory components from the backside power network (BSPN).

In some implementations, the frontside-to-backside transition cell architecture may be disposed between the frontside power network (FSPN) and the backside power network (BSPN). Therefore, in this instance, the frontside metal layers (M0, M2) may be disposed above the buried transition vias (BTV), and also, the buried transition vias (BTV) may be disposed above the backside metal layers (BM0).

In some implementations, the power rails (R1-R5) may refer to a first power rail (R1), a second power rail (R2), a third power rail (R3), a fourth power rail (R4), and a fifth power rail (R5). In the first power rail (R1), the frontside metals (M0, M2) may be formed above the backside metal (BM0), and the BTV metal may be used to couple one or more of the frontside metals (M0, M2) to the backside metal (BM0). In some instances, various portions of the first power rail (R1) may be coupled to different power supplies in different power domains. For instance, as shown in FIG. 2, portions of the first power rail (R1) may be used to couple the FS metals (M0, M2) and the BS metal (BM0) to ground, such as, e.g., an external ground (VSSE). Also, as shown in FIG. 2, other portions of the first power rail (R1) may be used to couple the FS metals (M0, M2) and the BS metal (BM0) to the periphery domain, such as, e.g., the external periphery domain (VDDPE).

In the second power rail (R2), the frontside metal (M2) may be formed above the other frontside metal (M0), and the frontside metals (M0, M2) may not be coupled to each other. Thus, in some implementations, the frontside metals (M0, M2) may serve as frontside power supply rails to various components and/or circuitry, such as, e.g., the FS bitcell circuitry 208 along with the one or more bitcells formed as part thereof. Therefore, as shown in FIG. 2, the second power rail (R2) may be used to couple the FS metals (M0, M2) to the core domain, such as, e.g., the internal core domain (VDDC).

In the third power rail (R3), the frontside metals (M0, M2) may be formed above the backside metal (BM0), and the BTV metal may be used to couple one or more of the frontside metals (M0, M2) to the backside metal (BM0). In some instances, various portions of the third power rail (R3) may be coupled to different power supplies in different power domains. For instance, as shown in FIG. 2, portions of the third power rail (R3) may be used to couple the FS metals (M0, M2) and the BS metal (BM0) to ground, such as, e.g., the external ground (VSSE). Also, as shown in FIG. 2, other portions of the third power rail (R3) may be used to couple the BS metal (BM0) to the core domain, such as, e.g., the external core domain (VDDCE). Further, as shown in FIG. 2, still other portions of the third power rail (R3) may be used to couple the FS metals (M0, M2) and the BS metal (BM0) to the periphery domain, such as, e.g., the internal periphery domain (VDDP). In some instances, bitlines (VDDP_BL) may be coupled to the internal periphery domain (VDDP) by way of the frontside metal (M0).

In the fourth power rail (R4), the frontside metal (M2) may be formed above the other frontside metal (M0), and the frontside metals (M0, M2) may not be coupled to each other. Therefore, in some implementations, the frontside metals (M0, M2) may serve as frontside power supply rails to various components and/or circuitry, such as, e.g., the FS bitcell circuitry 208 along with the one or more bitcells formed as part thereof. Further, as shown in FIG. 2, the fourth power rail (R4) may be used to couple the FS metals (M0, M2) to the core domain, such as, e.g., the internal core domain (VDDC).

In the fifth power rail (R5), the frontside metals (M0, M2) may be formed above the backside metal (BM0), and the BTV metal may be used to couple one or more of the frontside metals (M0, M2) to the backside metal (BM0). Thus, in some instances, various portions of the fifth power rail (R5) may be coupled to different power supplies in different power domains. For instance, as shown in FIG. 2, portions of the fifth power rail (R5) may be used to couple the FS metals (M0, M2) and the BS metal (BM0) to ground, such as, e.g., an external ground (VSSE). Also, as shown in FIG. 2, other portions of the fifth power rail (R5) may be used to couple the FS metals (M0, M2) and the BS metal (BM0) to the periphery domain, such as, e.g., the external periphery domain (VDDPE).

In some implementations, the PDN 204 may provide and couple the frontside power rails (R1-R5) to the memory circuitry, such as, e.g., the bitcell circuitry 208, which is formed above the backside power rails. The PDN 204 may also provide and couple the backside power rails (R1, R3, R5) to various components of the memory circuitry. Further details related to the voltage domain network (VDN) 304 including memory architecture (e.g., bitcell array, colmux, etc.) is described herein below in reference to FIG. 3. Also, in reference to FIGS. 2-3, the alignment lines (B1-B10) in FIG. 2 correspond to the same alignment lines (B1-B10) in FIG. 3.

Figure 3:
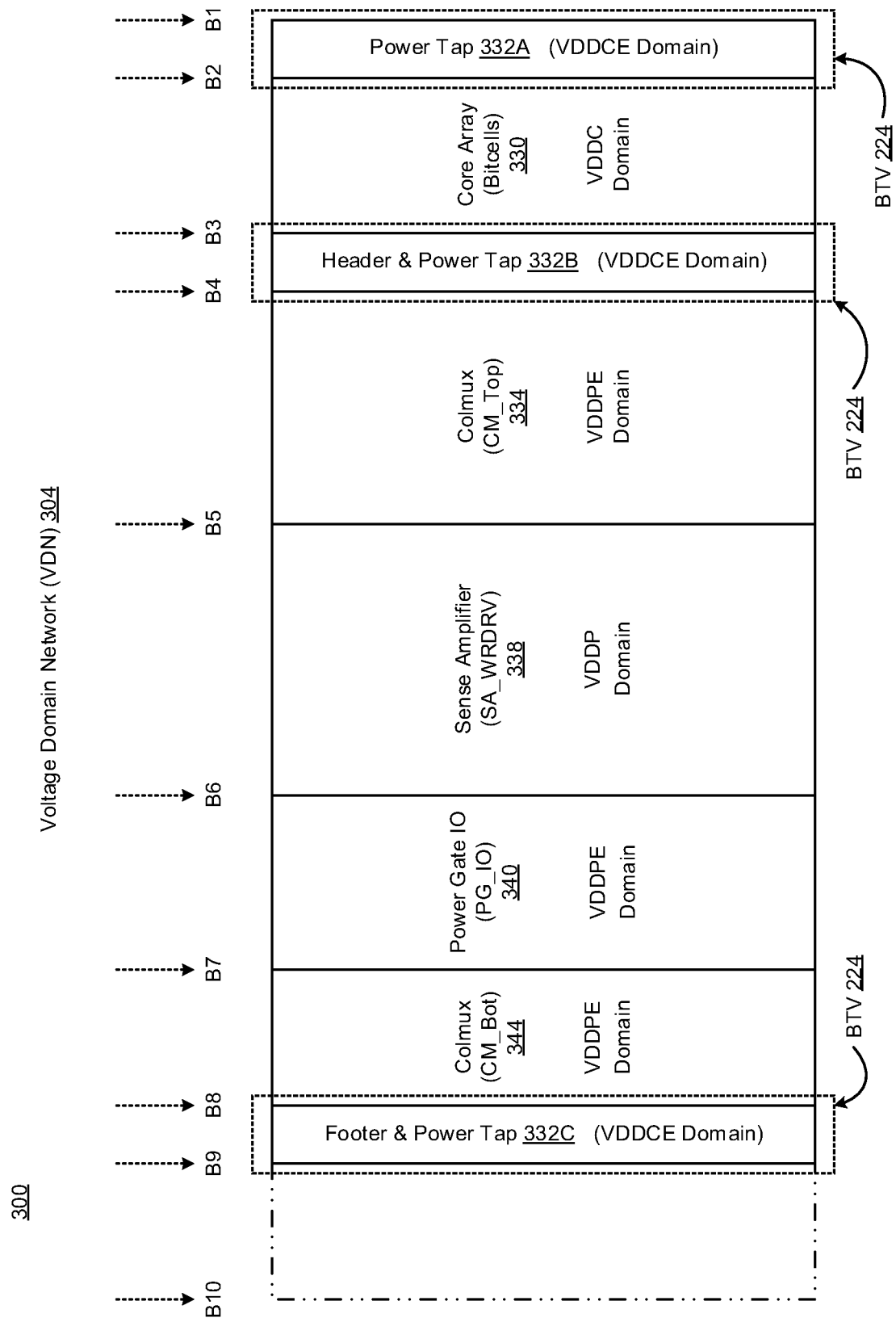
FIG. 3 illustrates a diagram of voltage domain network (VDN) in accordance with various implementations described herein.

FIG. 3 illustrates a schematic diagram 300 of voltage domain network (VDN) 304 in accordance with various implementations described herein.

As shown in FIG. 3, the voltage domain network (VDN) 304 may be applied to and implemented in memory circuitry having various components and/or circuitry that operate in multiple different power domains, such as, e.g., core domains (VDDC, VDDCE) and periphery domains (VDDP, VDDPE). In some implementations, the voltage domain network (VDN) 304 may include core array circuitry 330, column multiplexer circuitry (334, 344), sense amplifier circuitry 338, and power gate input-output (I/O) 340. Also, in some instances, the core array circuitry 330 may be formed as part of the frontside core, which operates in the core voltage domains (VDDC, VDDCE). Further, in some instances, the column multiplexer circuitry (colmux 334, 344), the sense amplifier circuitry 338, and the power gate I/O circuitry 340 may be formed as part of the memory circuitry, which may be configured to operate in the periphery voltage domains (VDDP, VDDPE). In particular, the upper or top colmux (CM_Top) 334, the lower or bottom colmux (CM_Bot) 334, and the power gate I/O 340 may operate in the external periphery voltage domain (VDDPE), and the sense amplifier along with the wordline driver (SA_WRDRV) 338 may operate in the internal periphery voltage domain (VDDP).

The core array 330 may include multiple bitcells that are arranged in columns and rows, and also, the core array 330 may be configured to operate in the internal core voltage domain (VDDC). The core array 330 may include multiple power taps, such as, e.g., a first power tap 332A, a second power tap 332B (that may be referred to as a header and power tap), and a third power tap 332C (that may be referred to as a footer and power tap). Also, the power taps 332A, 332B, 332C may be configured to operate in the external core voltage domain (VDDCE). In some implementations, the power taps 332A, 332B, 332C may be used as header logic to provide power (VDDCE) to the core array 330 (e.g., as VDDC) from the backside power network (BSPN) by way of the buried transition vias (BTV) 224. For instance, the backside power network (BSPN) may provide VDDCE power to the header logic 332A, 332B, 332C, and then the header logic 332A, 332B, 332C may provide VDDC power to the bitcells in the core array 330.

In some implementations, the voltage domain network (VDN) 304 may provide a power delivery architecture that keeps power to the core array 330 in the frontside and then transitions power to other memory components, such as, e.g., the column multiplexer circuitry (colmux 334, 344), from the backside. Also, the power delivery architecture may be configured to provide for frontside-to-backside power delivery transitioning between frontside power rails and backside power rails in various memory applications.

In some implementations, the voltage domain network (VDN) 304 may include core array circuitry 330 having an array of memory cells (or bitcells) arranged in columns and/or rows. In some instances, each memory cell in the core array 330 may be referred to as a bitcell, wherein each bitcell may be configured to store at least one data bit value (e.g., a data value associated with logical '0' or '1'). Also, each row of bitcells in the core array 330 may include any number of memory cells arranged in various configurations, such as, e.g., a two-dimensional (2D) core array 330 having columns and rows of bitcells arranged in a 2D grid pattern. Also, each bitcell in the core array 330 may be implemented with random access memory (RAM) circuitry, or some other type of volatile and/or non-volatile type memory. In some instances, each memory cell may include a multi-transistor static RAM (SRAM) cell, such as various types of SRAM cells, such as, e.g., 6T CMOS SRAM and/or other types of complementary MOS (CMOS) SRAM cells, such as, e.g., 4T, 8T, 10T, or more transistors per bit.

In some instances, the voltage domain network (VDN) 304 may refer to memory architecture having the core array 330 and column multiplexer circuitry (colmux 334, 344) that provides output circuitry coupled to the memory architecture via multiple bitlines for read/write memory access operations. Thus, the colmux 334, 344 may be coupled to the bitcells in the core array 330, and also, the colmux 334, 344 may include the upper or top colmux (CM_Top) 334 and the lower or bottom colmux (CM_Bot) 344 that receive column data from the bitcells in the core array 330 and provide column-multiplexed output data.

Figure 4:
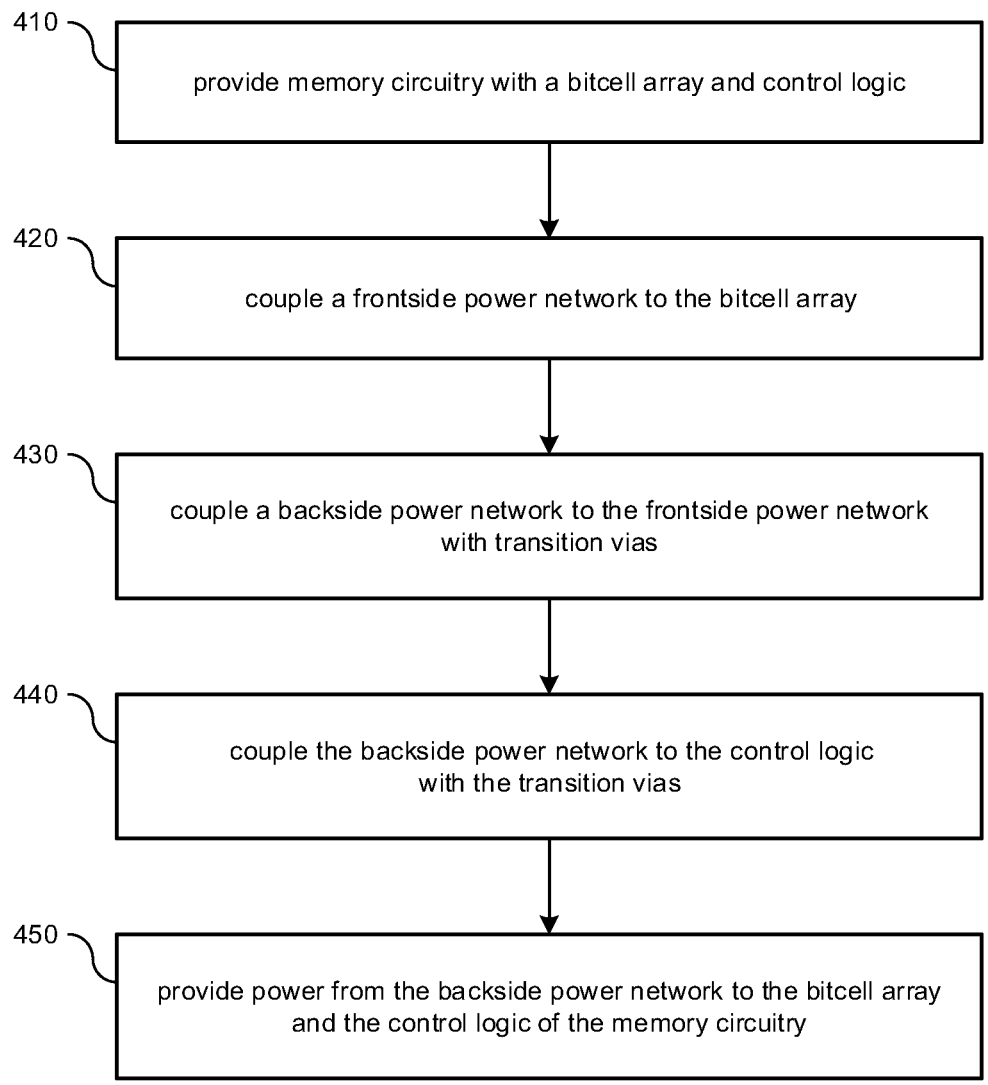
FIG. 4 illustrates a diagram of a method for providing buried power rail (BPR) architecture in accordance with implementations described herein.

FIG. 4 illustrates a process flow diagram of a method 400 for providing buried power rail (BPR) architecture in accordance with implementations described herein. Also, in some implementations, method 400 may be configured to provide backside-to-frontside transition architecture utilizing the buried power rail (BPR) architecture in accordance with various implementations described herein.

It should be understood that even though the method 400 indicates a particular order of operation execution, in some cases, various particular portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, the method 400 may be implemented as a program and/or software instruction process configured for providing various frontside-to-backside transitioning schemes and techniques, as described herein. Also, if implemented in software, instructions related to implementing method 400 may be stored in memory and/or a database. For instance, various types of computing devices having a processor and memory may be configured to perform method 400.

In various implementations, the method 400 may refer to a method of designing, providing, fabricating and/or manufacturing frontside-to-backside transitioning circuitry as an integrated system, device and/or circuit that may involve use of the various IC circuit components described herein so as to implement the frontside-to-backside transitioning schemes and techniques associated therewith. In some implementations, the frontside-to-backside transitioning circuitry may be integrated with computing circuitry and related components on a single chip, and the frontside-to-backside transitioning circuitry may be implemented in various embedded systems for automotive, electronic, mobile, server and Internet-of-things (IoT) applications, including remote sensor nodes.

At block 410, method 400 may provide memory circuitry with a bitcell array and control logic that is disposed adjacent to the bitcell array. The bitcell array includes bitcells arranged in an array and header logic coupled to the bitcells, and the control logic refers to input-output (I/O) control logic having various components such as sense amplifier logic and/or column multiplexer logic. At block 420, method 400 may couple a frontside power network (FSPN) to the bitcell array, and at block 430, method 400 may couple a backside power network (BSPN) to the frontside power network (FSPN) with transition vias.

At block 440, method 400 may couple the backside power network to the control logic with the transition vias, and at block 450, method 400 may provide power from the backside power network to the bitcell array and the control logic. In some instances, the backside power network may provide power to the bitcell array by way of the transition vias being coupled to the frontside power network, and also, the backside power network may provide power directly to the control logic by way of the transition vias.

In some implementations, the backside power network (BSPN) may include one or more backside power networks including, e.g., a first backside power network, a second backside power network, and a third backside power network. The first backside power network may be coupled to the frontside power network by way of the transition vias, the first backside power network may provide an external core voltage (VDDCE) to the header logic, and the header logic may receive the external core voltage (VDDCE) and provide an internal core voltage (VDDC) to the bitcells. The second backside power network may be coupled directly to the sense amplifier logic, and the second backside power network may provide an internal periphery voltage (VDDP) to the sense amplifier logic. Also, the third backside power network may be coupled directly to the column multiplexer logic, and the third backside power network may provide an external periphery voltage (VDDPE) to the column multiplexer logic.

In some implementations, the frontside power network (FSPN) may be formed with frontside metals, and the backside power network (BSPN) may be formed with buried backside metals that are disposed underneath the frontside metals. Also, the transition vias may refer to buried transition vias that are disposed between the frontside metals and the buried backside metals. Further, in some implementations, method 400 may provide backside-to-frontside transition cells that include the buried transition vias that are used to couple the backside power network to the frontside power network, and the backside power network may provide power to the bitcell array by way of the buried transition vias being coupled to the frontside power network.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include memory circuitry having a bitcell array, a frontside power network coupled to the bitcell array, and a backside power network that provides power to the bitcell array. The device may include transition vias that couple the backside power network to the frontside power network, and the backside power network may provide power to the bitcell array by way of the transition vias being coupled to the frontside power network.

Described herein are various implementations of a device. The device may include memory circuitry having control logic. The device may include a backside power network that provides power to the control logic. The device may include transition vias that couple the backside power network to the control logic. The backside power network may provide power directly to the control logic by way of the transition vias.

Described herein are various implementations of a method. The method may include providing memory circuitry with a bitcell array and control logic. The method may include coupling a frontside power network to the bitcell array. The method may include coupling a backside power network to the frontside power network with transition vias. The method may include coupling the backside power network to the control logic with the transition vias. The method may include providing power from the backside power network to the bitcell array and the control logic of the memory circuitry.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
  memory circuitry having a bitcell array, wherein the bitcell array includes bitcells arranged in an array and header logic coupled to the bitcells;
  a frontside power network coupled to the bitcell array;
  a backside power network that provides power to the bitcell array; and
  transition vias that couple the backside power network to the frontside power network,
  wherein the backside power network provides power to the bitcell array by way of the transition vias being coupled to the frontside power network wherein the backside power network comprises a first backside power network, and wherein the first backside power network provides an external core voltage (VDDCE) to the header logic.

2. The device of claim 1, wherein:
  the memory circuitry has control logic that is disposed adjacent to the bitcell array,
  the backside power network provides power to the control logic,
  the transition vias couple the backside power network to the control logic, and
  the backside power network provides power directly to the control logic by way of the transition vias.

3. The device of claim 2, wherein:
the control logic refers to input-output (I/O) control logic having sense amplifier logic and column multiplexer logic.

4. The device of claim 1, wherein the backside power network includes multiple backside power networks including the first backside power network, a second backside power network, and a third backside power network.

5. The device of claim 4, wherein:
the second backside power network is coupled directly to the sense amplifier logic, and
the second backside power network provides an internal periphery voltage (VDDP) to the sense amplifier logic.

6. The device of claim 4, wherein:
the third backside power network is coupled directly to the column multiplexer logic, and
the third backside power network provides an external periphery voltage (VDDPE) to the column multiplexer logic.

7. The device of claim 1, wherein:
the first backside power network is coupled to the frontside power network by way of the transition vias, and
the header logic receives the external core voltage (VDDCE) and provides an internal core voltage (VDDC) to the bitcells.

8. The device of claim 1, wherein:
the frontside power network is formed with frontside metals,
the backside power network is formed with buried backside metals that are disposed underneath the frontside metals, and
the transition vias refer to buried transition vias that are disposed between the frontside metals and the buried backside metals.

9. The device of claim 8, further comprising:
backside-to-frontside transition cells having the buried transition vias that couple the backside power network to the frontside power network,
wherein the backside power network provides power to the bitcell array by way of the buried transition vias being coupled to the frontside power network.

10. A device, comprising:
memory circuitry having control logic;
a backside power network that provides power to the control logic; and
transition vias that couple the backside power network to the control logic,
wherein the backside power network provides power to the control logic by way of the transition vias, wherein the control logic refers to input-output (I/O) control logic having sense amplifier logic and column multiplexer logic, wherein the backside power network comprises a first backside power network, and wherein the first backside power network is coupled directly to the sense amplifier logic.

11. The device of claim 10, wherein:
the memory circuitry has a bitcell array coupled to a frontside power network,
the bitcell array is disposed adjacent to the control logic,
the backside power network provides power to the bitcell array,
the transition vias couple the backside power network to the frontside power network, and
the backside power network provides power to the bitcell array by way of the transition vias being coupled to the frontside power network.

12. The device of claim 11, wherein:
the bitcell array includes bitcells arranged in an array and header logic coupled to the bitcells.

13. The device of claim 12, wherein the backside power network includes multiple backside power networks including the first backside power network, a second backside power network, and a third backside power network.

14. The device of claim 13, wherein:
the second backside power network is coupled to the frontside power network by way of the transition vias,
the second backside power network provides an external core voltage (VDDCE) to the header logic, and
the header logic receives the external core voltage (VDDCE) and provides an internal core voltage (VDDC) to the bitcells.

15. The device of claim 13, wherein:
the first backside power network provides an internal periphery voltage (VDDP) to the sense amplifier logic.

16. The device of claim 13, wherein:
the third backside power network is coupled directly to the column multiplexer logic, and
the third backside power network provides an external periphery voltage (VDDPE) to the column multiplexer logic.

17. The device of claim 10, wherein:
the frontside power network is formed with frontside metals,
the backside power network is formed with buried backside metals that are disposed underneath the frontside metals, and
the transition vias refer to buried transition vias that are disposed between the frontside metals and the buried backside metals.

18. The device of claim 17, further comprising:
backside-to-frontside transition cells having the buried transition vias that couple the backside power network to the control logic,
wherein the backside power network provides power directly to the control logic by way of the buried transition vias.

19. A method, comprising:
providing memory circuitry with a bitcell array and control logic;
coupling a frontside power network to the bitcell array;
coupling a backside power network to the frontside power network with transition vias;
coupling the backside power network to the control logic with the transition vias, wherein
the control logic refers to input-output (I/O) control logic having sense amplifier logic and column multiplexer logic;
coupling the backside power network to the column multiplexer logic; and
providing power from the backside power network to the bitcell array and the control logic of the memory circuitry.

20. The method of claim 19, wherein:
the backside power network provides an external periphery voltage (VDDPE) to the column multiplexer logic,
the control logic is disposed adjacent to the bitcell array,
the backside power network provides power to the bitcell array by way of the transition vias being coupled to the frontside power network, and
the backside power network provides power directly to the control logic by way of the transition vias.

* * * * *